United States Patent [19]

Eck

[11] Patent Number: 4,993,965
[45] Date of Patent: Feb. 19, 1991

[54] SUPPORT FOR FLOATED HEADER/CONNECTOR

[75] Inventor: Michael P. Eck, Wellsville, Pa.

[73] Assignee: E. I. du Pont de Nemours and Company, Wilmington, Del.

[21] Appl. No.: 438,960

[22] Filed: Nov. 16, 1989

Related U.S. Application Data

[62] Division of Ser. No. 192,473, May 10, 1988, abandoned.

[51] Int. Cl.⁵ ............................................. H01R 13/64
[52] U.S. Cl. ...................................... 439/374; 439/65; 439/248
[58] Field of Search ................... 439/64, 55, 374, 376, 439/377, 380, 381, 247, 248, 249, 526, 525, 246, 252, 65

[56] References Cited

U.S. PATENT DOCUMENTS

| | | | |
|---|---|---|---|
| 2,438,371 | 3/1948 | Macholz | 439/247 |
| 3,516,044 | 6/1970 | Barnes et al. | 439/381 |
| 3,900,239 | 8/1975 | Anhalt et al. | 439/526 |
| 4,204,737 | 5/1980 | Faber et al. | 439/377 |
| 4,241,968 | 12/1980 | Fukunaga | |
| 4,334,732 | 6/1982 | Roeschlein et al. | 439/248 |
| 4,470,100 | 9/1984 | Rebaudo et al. | |
| 4,550,959 | 11/1985 | Grabbe et al. | |
| 4,655,516 | 4/1987 | Shaffer et al. | 439/64 |

OTHER PUBLICATIONS

U.S. patent application Ser. No. 141,298 filed 1/88.

Primary Examiner—David L. Pirlot

[57] ABSTRACT

A mounting system for a connector or header mounted on a circuit board which accommodates misalignment caused by accumulated manufacturing tolerances or dimensional changes caused by temperature changes includes a support member having a continuous base portion that is at least longitudinally coextensive with the connectors or headers to be mounted on the printed circuit board. The base includes an array of through openings that are in general registration with the tail portions of the various pins or receptacles of the connectors. Lug structures extend upwardly from the base to retain the header or connector in place on the base. The through bores in the base are preferably tapered and have sufficient clearance to allow the tail portions to flex laterally in response to lateral insertion forces caused by misalignment between the mating headers and connectors.

19 Claims, 2 Drawing Sheets

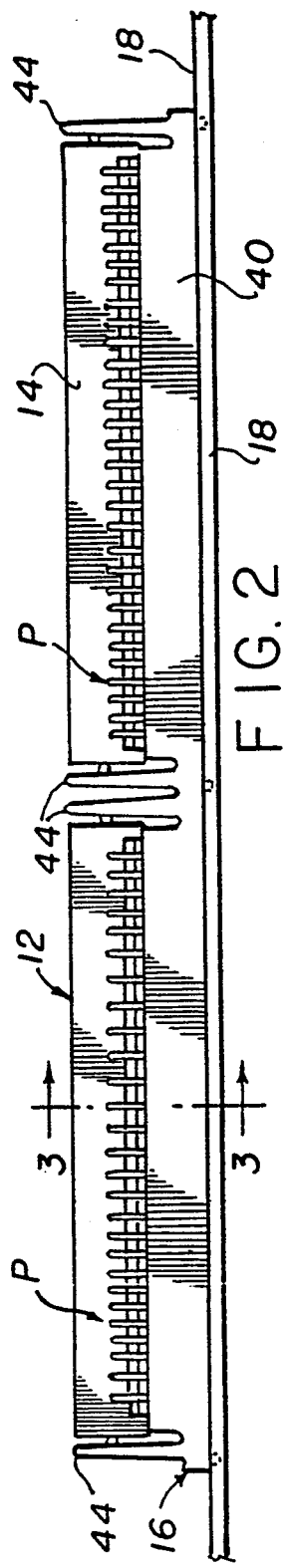
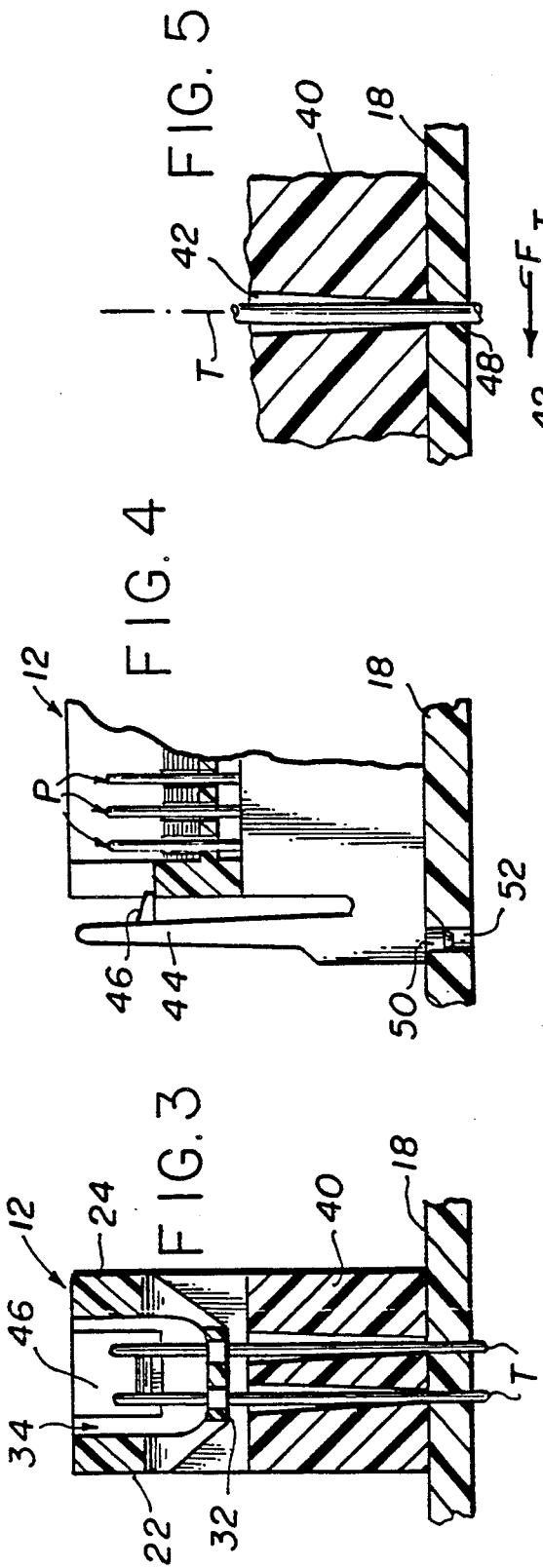

SUPPORT FOR FLOATED HEADER/CONNECTOR

This application is a division of application Ser. No. 192,473, filed May 10, 1988, now abandoned.

BACKGROUND OF THE INVENTION

The present invention relates to mounting systems for mounting multi-contact electrical headers or connectors on a printed circuit board and, more particularly, to mounting arrangements which allow a measure of relative movement between the connector or header and its printed circuit board.

In the design of electronic systems involving multiple printed circuit boards, it is common to effect circuit interconnection between the circuit boards by directly plugging one circuit board into another or using cable assemblies to effect the interconnection. In those designs that use cable assemblies, multi-contact headers or connectors are mounted on the various circuit boards and are interconnected with multi-conductor cables. In direct board-to-board type connection systems, a backplane or motherboard is provided with an appropriate number of receptacles for receiving and effecting electrical connection with respective daughterboards to form a complete system. The direct board-to-board system dispenses with the need for interconnection cables and allows the system designer to place as many electrical devices and circuits as is practical on the daughterboards to maximize packaging efficiency. In larger systems, the size of each circuit board can be quite large, for example, up to 24 inches (30 cm.) on a side. In such systems, a large number of circuit interconnections must oftentimes be effected, and, to this end, high density connector systems have been developed which locate the respective pins and receptacles on relatively close centers, for example, 0.050 inches (1.27 mm.) in a multi-row matrix so that several hundred or more circuit connects are possible per header.

In general, the use of a single high density header on a printed circuit board does not entail special mounting considerations. However, where the circuit board is relatively large and the number of circuit connects requires the use of two or more separate headers or connectors on the printed circuit board, problems can be encountered under certain circumstances when mating two printed circuit boards. In such multi-header applications, the printed circuit board manufacturer establishes the position and arrangement of the mounting holes for each header. The dimensional tolerances for each group of mounting holes can accumulate in such a way that the headers in a multi-header application are misaligned relative to their design-specified positions. While the misalignment is typically less than a few thousandth of an inch, the misalignment increases the insertion forces required to effect engagement of the parts and stresses the circuit boards. In extreme situations, the stress may be sufficient to 'bow' the circuit board out of it normal plane and may be sufficient to cause 'stubbing,' that is, the failure of one or more pins to mate with their respective receptacles and subject the parts to deformation or bending. In addition, the circuit boards, in their ultimate application, can operate at an elevated temperature sufficient to cause physical expansion of the boards. For example, where a circuit board has two or more headers along its edge which mate with corresponding connectors on another circuit board, the spacing between the connectors and their headers can increase somewhat because of changes in the operating temperature. Should it be necessary to disengage a thermally hot circuit board and effect replacement with a circuit board that is at room temperature, the difference in physical size and connector spacing can greatly increase the insertion force and, particularly where small pin center dimensions are used, and can unduly stress the circuit boards and their components.

Various mounting arrangements have been used to address the above problem and accommodate the misalignment. For example, U.S. Pat. No. 4,470,100 to Rebaudo et al. carries the connectors on a bracket that is coupled to its circuit board by a pin-and-slot arrangement that allows a measure of relative movement between the connectors and the circuit board. Electrical connection between the bracket-mounted connector and its circuit board is effected by a flex circuit between the connectors and the circuit board. While such mounting systems, as represented by Rebaudo et al., are effective, they represent a cost increment that limits their application to systems in which cost is not a primary factor.

SUMMARY OF THE INVENTION

In view of the above, it is an object of the present invention, among others, to provide a system for mounting headers or connectors onto a printed circuit board by which dimensional misalignments between the mating components can be readily accommodated.

It is another object of the present invention to provide a system for mounting headers or connectors onto a printed circuit board which will accommodate dimensional changes consequent to accumulated manufacturing tolerances or to thermal expansion of a printed circuit board.

It is still another object of the present invention to provide an inexpensive mounting system for mounting connectors or headers onto a printed circuit board which is well suited for circuit boards having plural connectors or headers for mating with respective headers or connectors mounted on another printed circuit board.

In view of these objects, and others, the present invention provides a mounting system which allows a measure of lateral movement for a connector or header mounted on a circuit board to accommodate the misalignment caused by accumulated manufacturing tolerances or changes in operating temperature. A support member includes a continuous base portion that is at least longitudinally coextensive with the connectors or headers to be mounted on the printed circuit board. The base includes an array of through openings that are in general registration with the tail portions of the various pins or receptacles of the connector. Walls extend upwardly from the base for each of the headers and include lugs for retaining the header or connector on the base. The through openings in the base are preferably tapered and have sufficient lateral or side clearance to allow the tail portions to flex laterally in response to laterally directed forces caused by misalignment between the mating headers and connectors.

The present invention advantageously provides a connector mounting system in which the header or connector can move laterally relative to its printed circuit board to accommodate any misalignment consequent to accumulated manufacturing tolerances or dimensional changes consequence to thermal expansion or contraction. The present invention is particularly well suited for use in systems in which multiple connectors or headers on one printed circuit board are to be connected to corresponding connectors or headers on another circuit board.

Other objects and further scope of applicability of the present invention will become apparent from the detailed description to follow, taken in conjunction with the accompanying drawings in which like parts are designated by like reference characters.

BRIEF DESCRIPTION OF THE DRAWING

FIG. 2 is an assembled front view of the floated header support of FIG. 1;

FIG. 3 is a detailed view, in partial cross section, of pins extending through a base portion the support;

FIG. 4 is a detailed view, in cross section, of the end portion of the header support illustrating the manner by which the header is latched into its assembled position on the support;

FIG. 5 is an enlarged detailed view, in cross section, of a tail portion of a pin extending through a base portion of the floated header support;

FIG. 6 is an enlarged detailed view, similar to FIG. 5, illustrating the tail portion yielding in response to a lateral force developed as a result of misalignment between the header and its mating connector; and FIG. 7 is a plan view of FIG. 6 showing the realignment of the tail portion in response to the lateral force.

DESCRIPTION OF THE PREFERRED EMBODIMENT

Figure 1:
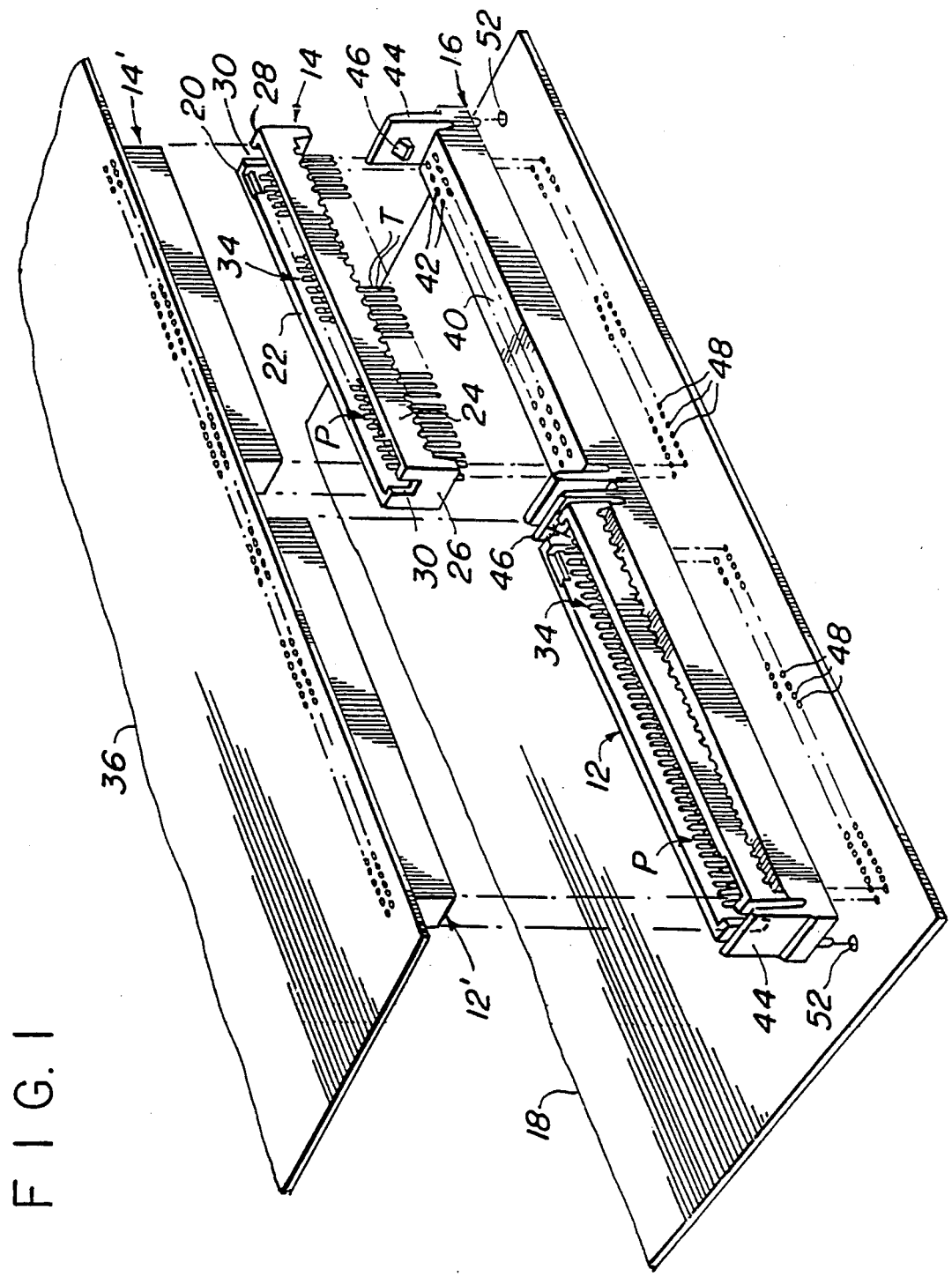
FIG. 1 is an exploded perspective of a support for mounting a header on a printed circuit board in accordance with the present invention.

An exemplary support for headers or connectors in accordance with the present invention is shown in exploded perspective in FIG. 1 and in front elevation in FIG. 2 and is designated generally therein by the reference character 10. As shown, first and second headers 12 and 14 are mounted adjacent to one another on a support 16 with the support 16 mounted upon a printed circuit board 18. In the preferred embodiment, each of the headers, for example, the header 14, is formed from a molded plastic body 20 having longitudinally extending sidewalls 22 and 24 and end walls 26 and 28 with notches 30 formed in the upper portion of each end wall 26 and 28. The various walls, along with a bottom wall 32 (FIG. 3), define a longitudinally extending cavity or recess 34 that is designed to accept a mating connector. In the exemplary embodiment of FIG. 1, mating connectors 12' and 14' are shown mounted upon a printed circuit board 36 in a configuration that allows convenient insertion and removal of the connectors 12' and 14' into the recesses 34 of the respective headers 12 and 14. As can be appreciated, other mounting arrangements for the connectors 12' and 14' can be utilized. An array or matrix of pins P are carried by each header 12 and 14 and are designed to engage corresponding receptacles (not shown) in the connectors 12' and 14'. The pins P can have a circular or rectangular cross section and, as shown in the detail of FIG. 3, each pin P includes an upper portion (unnumbered) that extends into the recess 34 and a depending or downwardly extending solder tail portion T with each pin P retained within an appropriately sized bore (unnumbered) in the bottom wall 32 of the header. In the embodiment illustrated, each header 12 and 14 is provided with two parallel rows of phosphor-bronze alloy pins P mounted on 0.050 inch (1.27 mm) centers. Suitable multi-row headers and connectors include the high density RIB CAGE connector system marketed by DuPont Electronics of New Cumberland, PA 17070.

The support 16 is preferably molded from a strong, resilient plastic such as a glass-filled, flame retardant plastic. A suitable material includes 8210R plastic manufactured by the General Electric Company under the ALL TEMP designation. For the embodiment shown in FIG. 1, the support 16 includes a continuous base portion 40 that is at least longitudinally coextensive in length with that of the two headers 12 and 14 and which includes an array of through bores or openings 42 (FIG. 1) that are in general registration with the tail portions T of the various pins P. A pair of upstanding walls 44 extend upwardly from the base 40 for each of the headers 12 and 14 with the facing surfaces of the walls 44 of each pair having a lug 46 facing the other. The distance dimension between the facing surfaces of each pair of walls 44 is somewhat larger than the overall end-to-end length of each header to allow convenient insertion of the headers 12 and 14 onto the support 16 and to allow a measure of lateral movement relative to the support 16. The headers 12 and 14 are mounted to the support 16 by aligning the tail portions T with the through openings 42 in the base 40 and pushing the headers into position. The walls 44 yield away from each other as each header is pushed into position until the lugs 46 clear and move into their respective notches 30, as shown in the detail of FIG. 4, to retain the header in place. The material from which the support 16 is fabricated should be sufficiently resilient to allow a measure of flexure as the headers 12 and 14 are mounted to the support 16.

As shown in FIG. 1, the printed circuit board 18 is provided with an array of through holes 48 that correspond in number and position with the tail portions T extending from the openings 42 in the base 40. The support 16 and its headers 12 and 14 are mounted upon the printed circuit board 18 by aligning and inserting the tail portions T into their respective holes 48. In general, the tail portions T extend through the printed circuit board 18 and are soldered in place on the bottom side of the printed circuit board 18, as is conventional in the art. If desired and as shown in FIG. 4, one or more tabs 50 extend from the underside of the base 40 and are received in a complementary opening 52 (FIG. 1) formed in the printed circuit board 18 to assist in aligning and mounting the support 16 on the surface of the printed circuit board 18.

The support 16 is designed, as explained below, to provide a range of movement for the headers 12 and 14 to accommodate the accumulated tolerance or other misalignment errors. For example, where the connector 14' is spaced a greater than nominal dimension from the connector 12', the headers 12 and 14, when engaged by their connectors 12' and 14', will yield laterally somewhat to realign themselves with their connectors 12'and 14' to thus accommodate the misalignment.

As shown in FIG. 5, each of the through openings 42 is formed as a portion of a conical surface that is wider at the top, adjacent the headers, and converges towards its corresponding hole 48 in the printed circuit board 18. The tail portion T passes generally concentrically through its hole 42 in the base 40 and the corresponding hole 48 in the printed circuit board 18. The tapered configuration assists in guiding the various tail portions T into their respective through holes 42 and provides a lateral clearance space for the tail portions T when the headers 12 and 14 are subjected to a lateral force. For example, in the event that the connectors 12' and 14' are not in their optimum location for proper mating, the connectors 12' and 14', as they enter their respective recesses 34 of the headers 12 and 14, will engage appropriate lead-in surfaces and apply a lateral force to the headers 12 and 14. By virtue of the mounting arrangement described, the various tail portions T will yield in the direction of the applied force F, as represented in exaggerated form in FIGS. 6 and 7, to allow one or both headers 12 and 14 to realign with their respective connector 12' and 14' and thus relieve any lateral misalignment force. As can be appreciated, the tail portion T can yield in any direction within the limits established by the sidewall surfaces that define its through opening 42 to thus accommodate misalignment in either or both the lateral or longitudinal directions.

The misalignment typically arises in multi-header and multi-connector applications in which an out-of-specification condition is present for the specific printed circuit board so that the pins P of the headers 12 and 14 are not coaxially aligned with the receptacles of their corresponding connectors 12' and 14' during mating. In addition, misalignment can occur when mating is attempted between printed circuit boards that are at significantly different temperatures. For example, when a set of connectors is mated with their headers at ambient temperature, mating of the connectors on the one circuit board with the headers on the other circuit board is accomplished in the usual manner with any misalignment limited to cumulative manufacturing tolerances. However, where one of the circuit boards is at a temperature substantially different from the other, the thermal expansion coefficient of the parts will cause the hotter components to physically expand relative to the other and present a misalignment condition. In general, the dimensional misalignment, whether from cumulative manufacturing tolerances or temperature differences, will usually amount to no more that 0.010 inches or so.

The section of the tail portion T that extends through the base 40 of the header 16 represents a 'column' that is subject to both compression forces during connector insertion as well as the lateral forces F developed as a consequence of the misalignment mentioned above. For a tail portion T having a fixed side dimension in transverse cross section (in the case of a rectangular tail portion T) or a fixed diameter dimension (in the case of a cylindrical tail portion) and a material-specific modulus of elasticity (i.e., phosphor-bronze), the column length, as defined by the thickness of the base 40 of the header 16, represents a variable that can be selected to provide the desired lateral resilience for the expected misalignment. As can be appreciated, a longer column length will provide a more yieldable mounting and a shorter column length will provide a stiffer mounting. In general, the optimum column length is determined empirically for the specific application.

In the preferred embodiment of the invention, in which the tail portions T have a rectangular cross section (0.009×0.012 inches), a suitable column length dimension, which also corresponds to the thickness of the base 40 of the support 16, is in the range of 0.100 inches to 0.600 inches with the embodiment of FIG. 1 having a 0.234+0.025 inch column length. This length is sufficient to allow yielding to accommodate a possible 0.010 inch or so misalignment discussed above for the particular tail portions T used.

As shown in FIG. 5, the through opening 42 is conically tapered from the larger open end to the smaller, lower end. In the preferred embodiment, the upper end has a diameter of about 0.030 to 0.035 inches, this dimension functioning to provide a guide or lead-in surface to facilitate assembly of the headers 12 and 14 to the support 16 and also sufficient to accommodate the expected range of displacement at the upper end of the tail portion T. The lower end of the through opening 42 typically presents a small clearance fit with the tail portion T. For a rectangular tail portion having a 0.009×0.012 inch cross section, a diameter of 0.019 inches for the lower opening is suitable. The tapered through opening 42 facilitates assembly of the tail portions T to the circuit board 18 and is also effective to constrain the lower end of the tail portions T where they enter the through bores 48 in the printed circuit board 18 while allowing the displacement to occur in the upper portion of the through opening 42. While the tapered through opening configuration is preferred, other configurations, including a cylindrical bore, a stepped cylindrical bore, or a tapered opening that is the inverse of that shown above, are suitable.

In the embodiment shown, two headers 12 and 14 are shown mounted in an end wise relationship to one another. As can be appreciated, a larger number of headers or connectors can be so mounted. In addition to the end wise mounting disclosed, the present invention can be used to mount headers or connectors in a parallel, side-by-side relationship. While the support system has been shown in the context of a printed circuit board application, as can be appreciated, the connectors or headers can also be mounted in accordance with the present invention on other generally planar surfaces and subtrates.

The present invention advantageously provides a mounting system in which the header or connector can yieldably move laterally relative to its printed circuit board to accommodate any misalignment consequent to accumulated manufacturing tolerances or dimensional changes consequence to thermal expansion or contraction and which is particularly well suited for use in a system in which multiple connectors or headers on one printed circuit board are to be connected to corresponding connectors or headers on another circuit board.

As will be apparent to those skilled in the art, various changes and modifications may be made to the illustrated support for floated header/connector mounting of the present invention without departing from the spirit and scope of the invention as determined in the appended claims and their legal equivalent.

What is claimed is:

1. A system for mounting a connector or header to a circuit board substrate, comprising:
   a connector body having a plurality of electrical contacts and corresponding tail portions extending therefrom, said connector body and electrical contacts connectable with a mating connector body and said tail portions mountable through holes in a circuit board substrate;
   a support member adapted for mounting on a surface of said substrate, said support member having a solid base provided with a plurality of tapered through openings wider at one end than the other end and aligned with the holes of said circuit board substrate, said wider end accepting and guiding said tail portions to and through said substrate holes, the through openings each having an axial length dimension and having a minimum transverse dimension at said other end larger than the corresponding transverse dimension of the tail portion to define a clearance space sufficient to accommodate yielding of the tail portions in response to a lateral movement of said connector body relative to the substrate in response to a laterally directed force; means for retaining the connector on said base, and first and second walls extending from said base and spaced from opposite ends of the connector body, said body thereby being free to move both laterally and longitudinally on said base.

2. The mounting system of claim 1, wherein at the other end, said through openings have approximately the same transverse dimension as the holes of the circuit board substrate.

3. The mounting sytem of claim 1, wherein each tapered through opening is defined by a conically tapered surface of revolution about an axis.

4. The system of claim 1, further comprising:
tab means extending from said base to be received within a tab-receiving opening in a substrate upon which the support member is mounted.

5. A system for mounting a plurality of connectors or headers to a circuit board substrate, comprising:
a plurality of connector bodies each having a plurality of electrical contacts and corresponding tail portions extending therefrom, each of said connector bodies and its electrical contacts connectable with a respective mating connector body and said tail portions mountable through holes in a circuit board substrate;
a support member adapted for mounting on a surface of said substrate, said support member having a solid base provided with a plurality of tapered through openings wider at one end than the other end and aligned with the holes of said circuit board substrate, said wider end accepting and guiding said tail portions of each of said connector bodies to and through said substrate holes, the through openings having an axial length dimension and having a minimum transverse dimension at the other end larger than the corresponding transverse dimension of the tail portions and approximately equal to the transverse dimension of the circuit substrate hole to define a conically tapered clearance space sufficient to accommodate yielding of the tail portions in response to a lateral movement of the respective connector bodies relative to the substrate in response to a laterally directed force applied to one or both of said at least first and second connector bodies;
latch means for retaining the connectors on said body; and
first and second walls extending from said base and spaced from opposite ends of the connector body, said body thereby being free to move both laterally and longitudinally on said base.

6. The mounting system of claim 5, further comprising a plurality of walls extending from said base; there being a pair of walls for each connector body, said walls being spaced from the ends of the respective bodies.

7. The mounting system of claim 6, further comprising lug means extending from each pair of walls and received within lug-receiving notches formed in a connector body for retaining the connector body on said base.

8. The system of claim 5, further comprising:
at least first and second walls extending from said base and adjacent opposite sides of the first of the connector bodies and at least third and fourth walls extending from said base adjacent opposite sides of the second of the connector bodies.

9. A support member for mounting a connector or header to a circuit board substrate, the connector or header having a plurality of tail portions extending therefrom, mountable through holes in said circuit board substrate, said support member comprising:
a solid base adapted for mounting on a surface of said circuit substrate, said base having a plurality of tapered through openings wider at one end than the other end and adapted to be aligned with the holes of said circuit board substrate, said wider end accepting and guiding tail portions extending from said connector body to and through said circuit board substrate holes, the through openings having an axial length dimension and a minimum transverse dimension at the other larger than the corresponding transverse dimension of the tail portion to define a clearance sufficient to accommodate yielding of the tail portions in response to a lateral movement of said connector body relative to the substrate in response to a laterally directed force,
latching means for retaining the connector on said base, and
first and second walls extending from said base and spaced from opposite ends of the connector body, said body thereby being free to move both laterally and longitudinally on said base.

10. The support member of claim 9, wherein said latch means comprises:
at least first and second walls extending from said base adjacent opposite sides of the connector body and having lug means extending therefrom.

11. The support member of claim 9, further comprising:
tab means extending from said base to be received within a tab-receiving opening in a substrate upon which the support member is mounted.

12. The support member of claim 9, wherein the axial length dimension is between 0.100 inches and 0.600

13. The support member of claim 9, wherein at the other end, said through openings have approximately the same transverse dimension as the holes of the circuit board substrate.

14. THe support member of claim 13, wherein the wider opening end of the through openings are between 0.025 and 0.035 inches in diameter.

15. The support member of claim 13, wherein the through openings are defined by a conically tapered surface of revolution about an axis.

16. A support member for mounting at least two connectors or headers to a circuit board substrate, the respective connectors or headers having a plurality of tail portions extending therefrom on mountable through holes in said circuit board substrate, said support member comprising:
a solid base provided with conically tapered through openings adapted for mounting on a surface of said circuit substrate, said through openings being wider at one end for accepting and guiding the tail portions extending from the connector bodies through said circuit substrate holes, the through openings each having an axial length dimension and a transverse minimum dimension at the other end larger than the corresponding transverse dimension of the tail portion to define a conically tapered clearance space sufficient to accommodate yielding of the tail portions in response to a lateral movement of the respective connector body relative to the substrate in response to a laterally directed force, latching means for retaining the connector on said body, and first and second walls extending from said base and spaced from opposite end of the connector body, said body thereby being free to move both laterally and longitudinally on said base.

17. The support member of claim 16, wherein the axial length dimension is between 0.100 inches and 0.600 inches.

18. The support member of claim 16, wherein at the other end said through openings are alignable with and have approximately the same transverse dimension as the holes of the circuit board substrate.

19. The support member of claim 18, wherein the wider opening end of the through openings are between 0.025 and 0.035 inches in diameter.

* * * * *